(12) United States Patent
Mofield

(10) Patent No.: US 7,336,082 B1
(45) Date of Patent: Feb. 26, 2008

(54) VEHICLE CIRCUIT TESTER

(76) Inventor: Marvin Mofield, 515 N. Woods Ave., Evansville, Vanderburgh County, IN (US) 47712-6447

( * ) Notice: Subject to any disclaimer, the term of this patent is extended or adjusted under 35 U.S.C. 154(b) by 58 days.

(21) Appl. No.: 11/515,541

(22) Filed: Sep. 5, 2006

(51) Int. Cl.
*G01R 31/00* (2006.01)
(52) U.S. Cl. ...................................... 324/504; 324/503
(58) Field of Classification Search ................ 324/504, 324/503; 340/431
See application file for complete search history.

(56) References Cited

U.S. PATENT DOCUMENTS

| | | | | | |
|---|---|---|---|---|---|
| 3,663,939 | A | * | 5/1972 | Olsson | 320/107 |
| 3,909,948 | A | * | 10/1975 | Markfelt | 33/716 |
| 4,215,306 | A | * | 7/1980 | Mace | 320/105 |
| 4,866,390 | A | * | 9/1989 | Butchko | 324/504 |
| 5,990,788 | A | * | 11/1999 | Syracuse | 340/458 |
| 6,081,189 | A | * | 6/2000 | Warner | 340/458 |

\* cited by examiner

*Primary Examiner*—Walter Benson
(74) *Attorney, Agent, or Firm*—Gary K. Price, Esq.

(57) ABSTRACT

A vehicle circuit tester for electrically testing the circuit system of a trailer. The tester can connect to a variety of types of trailers for the purpose of analyzing or monitoring the trailer's circuit system. The tester includes indicators that indicate continuity of the various circuits, thus confirming operability of the trailer lamps. The tester includes wiring connectors in a variety of dimensions and plug configurations, most of which are standardized and widely adopted. As such, the vehicle circuit tester is provided with a plurality of wiring connectors conventionally provided on different sizes and types of trailers. The tester includes probe and ground wires that can be wound up on a reel inside the tester.

17 Claims, 9 Drawing Sheets

FIG. 8
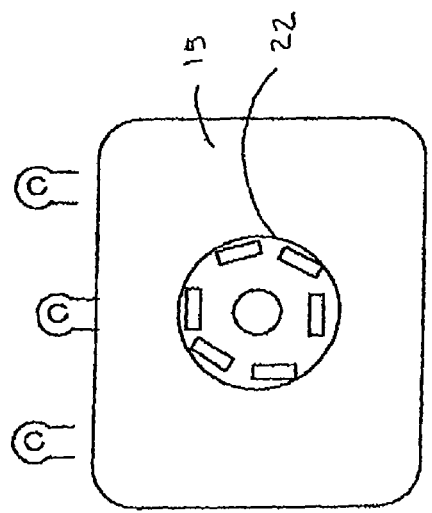
Fig 8B
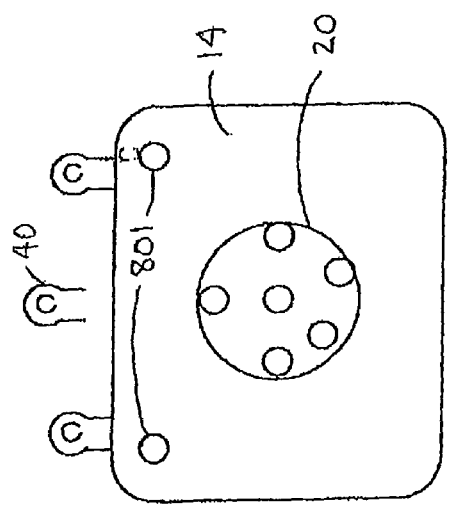
Fig 8A

VEHICLE CIRCUIT TESTER

CROSS REFERENCES TO RELATED APPLICATIONS

U.S. Provisional Application for Patent No. 60/706,517, filed Aug. 8, 2005, with title "Vehicle Circuit Tester" which is hereby incorporated by reference. Applicant claims priority pursuant to 35 U.S.C. Par. 119(e)(i).

STATEMENT AS TO RIGHTS TO INVENTIONS MADE UNDER FEDERALLY SPONSORED RESEARCH AND DEVELOPMENT

Not applicable.

BACKGROUND OF THE INVENTION

1. Field of the Invention

The present invention is directed generally to a testing apparatus in particular for a tester suitable for, but not restricted to, testing of electrical circuits such as are found in trailers and towing vehicles.

2. Background Information

Virtually all trailers are equipped with a standard set of rear lights that include turn lights, marker lights, back-up lights and brake lights for example. Inspecting these lights is usually quite time consuming and often annoying. For example, it is not uncommon for the inspector to first activate the selected rear light and then the inspector or inspector's assistant walk to the rear of the trailer and determine whether the corresponding lights are operating property. Again, this is often quite cumbersome and inconvenient. This process of manually activating each lighting system, and then walking around the trailer to verify proper performance is also quite time consuming and obviously inefficient and in the case of brake lights, almost impossible for one person.

While there are prior art devices, such as U.S. Pat. No. 5,990,788 to Syracuse, designed specifically for testing a trailer's rear lighting system, such devices lack the ability to be compatible with a variety of receptacles or electrical interface components. As such, none of these prior art devices, taken either singly or in combination, is seen to describe the instant invention.

Accordingly, there is a need for an improved vehicle circuit tester for conveniently testing a trailer's rear lighting system including turn signal lights, marker lights, back-up lights, braking lights, with the ability to be compatible with a variety of receptacles and electrical interface components. The present invention meets these needs.

SUMMARY OF THE INVENTION

The present invention provides a small, compact device which an individual technician can connect to a variety of types of trailers for the purpose of analyzing or monitoring the trailer's lighting system. The tester device includes indicators that indicate continuity of the various circuits, thus confirming operability of the trailer lamps.

The vehicle circuit tester is specifically intended to be compatible with most trailers. In particular, the present invention includes wiring connectors in a variety of dimensions and plug configurations, most of which are standardized and widely adopted. As such, the vehicle circuit tester is provided with a plurality of wiring connectors conventionally provided on different sizes and types of trailers.

BRIEF DESCRIPTION OF THE DRAWINGS

FIGS. 8A and 8B show end views of the exterior of the device.

DESCRIPTION OF THE PREFERRED EMBODIMENTS

In accordance with the present invention, a vehicle circuit tester is disclosed. The vehicle circuit tester of the present invention is directed to a small, compact device which can be connected to a variety of types of trailers or other vehicles for the purpose of analyzing or monitoring the trailer's lighting system. More particularly, the present invention includes wiring connectors in a variety of dimensions and plug configurations, most of which are standardized and widely adopted. As such, the vehicle circuit tester is provided with a plurality of wiring connectors conventionally provided on different sizes and types of trailers. In the broadest context, the vehicle circuit tester of the present invention consist of components configured and correlated with respect to each other so as to attain the desired objective.

Figure 1:
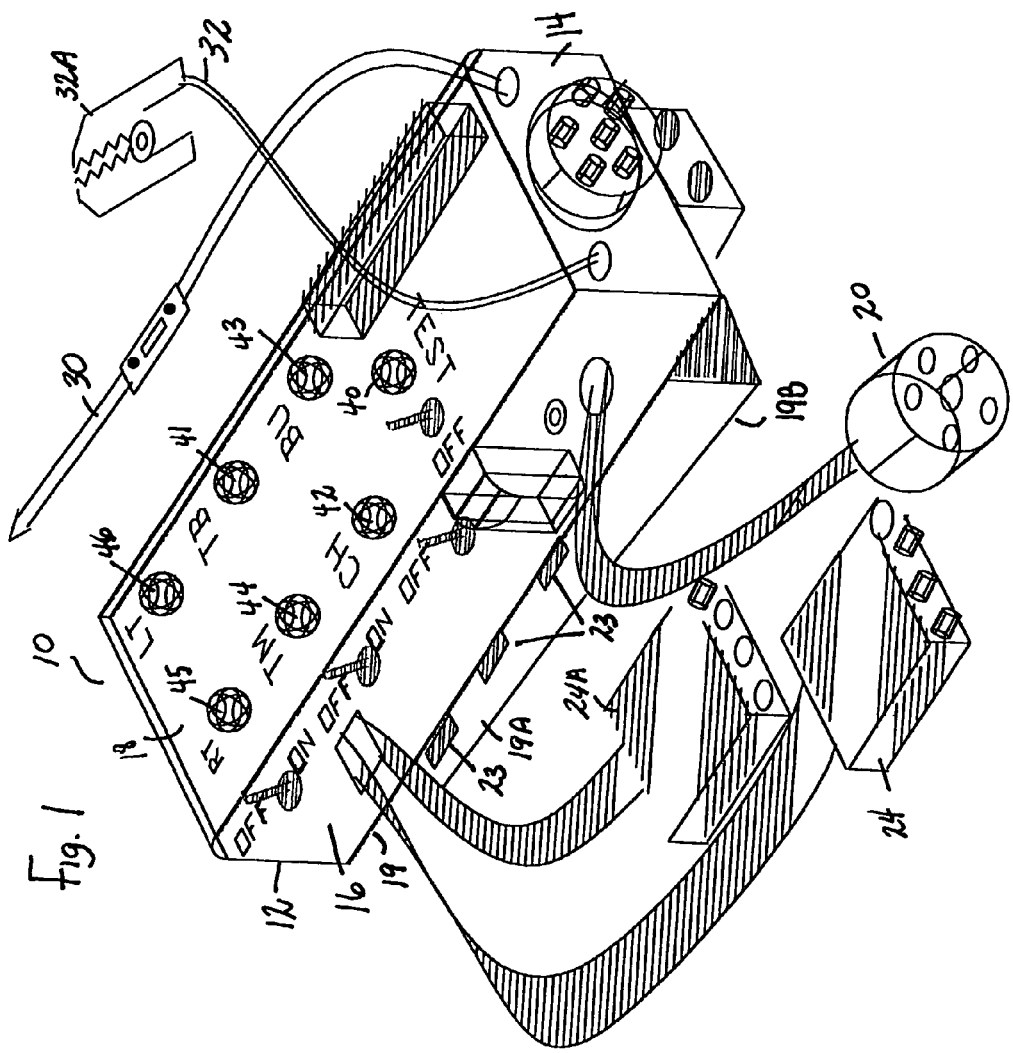
FIG. 1 is a perspective top view of the preferred embodiment of the present invention, a vehicle circuit tester.
Figure 2:
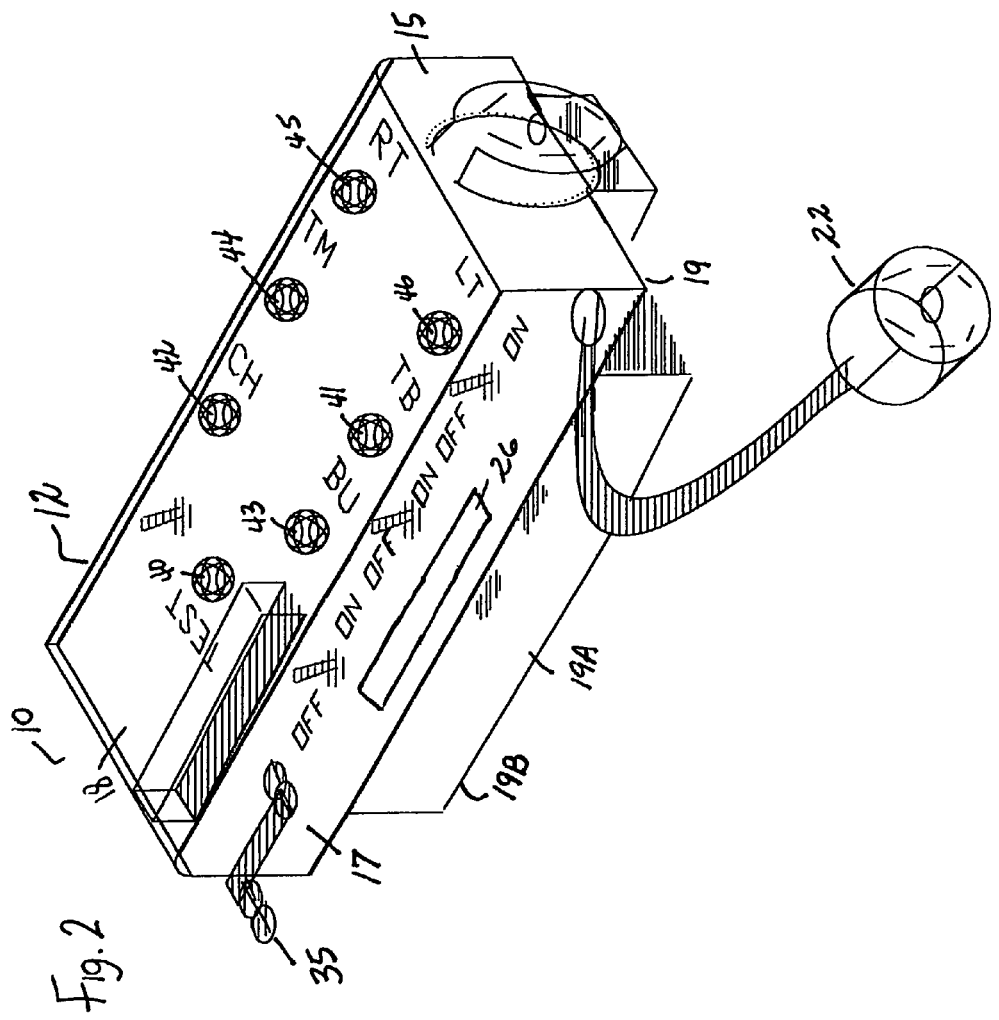
FIG. 2 is another perspective view of the vehicle circuit tester of FIG. 1.

FIGS. 1 and 2 illustrate perspective views of a vehicle circuit tester 10 made in accordance with the present invention. The tester 10 includes a housing 12 that encloses electrical circuitry, and a reel 600 (shown in FIG. 6), for retracting or playing wiring as will be further discussed. This compact device enables the tester 10 to be held or positioned, connected and operated by one person.

The housing 12 is preferably constructed of a molded plastic although various other materials, including metals and metal alloys may be employed. The size of the housing 12 and as a result the size of the entire tester 10 may be varied somewhat within the scope of this invention. However, the tester 10 should be sufficiently compact so that it can be conveniently carried by a single person, preferably in one hand.

As illustrated, the tester 10 includes wiring necessary to test the electrical systems of a trailer. As will be described the wiring connectors are selected from a number of standard varieties employed extensively in the transportation industry. Different or dissimilar connectors are provided so that tester 10 can be quickly connected to many of the various types of trailers in use today. As shown, connector 20 is a 6-way connector commonly used with trailers. Connector 22 is a 7-way connector. Connector 24 is a four-pin plug which fits for example the standard socket used for conducting electrical illumination signals from a towing vehicle to trailers. It will be understood by those in the art that both male and female connectors con be supplied.

In the preferred embodiment, connector 20 is provided adjacent a first panel 14 of the housing 12, connector 22 is provided preferably adjacent a second panel 15 of the housing 12 opposite the first panel 14. Connector 24 is preferably provided on a first side panel 16 of the housing 12.

As further illustrated, a probe wire 30 and ground wire 32 are further provided on the first panel 14 of the housing 12. The probe wire 30 and the ground wire 32 are useful for single wire testing as well as for establishing a good ground and testing ground which is critical in vehicle lighting. Opposite ends (shown in FIG. 6) of the wires 30, 32 are electrically connected within the housing 12 and are further in communication with the reel 600 in the housing 12. A reel operator such as handle 35 is disposed on a second side panel 17 of the housing 12. The handle 35 is attached to the reel 600 within the housing 12 so that cranking or turning the handle 35 either reels or unreels the probe wire 30 and the ground wire 32 and clip 32A. It is critical to understand that during application of the handle 35 as described above (reeling or unreeling the wires 32, 35) the wires 32, 35 remain electrically connected within the housing 12.

As discussed, each connector described essentially duplicates those found on trailer towing vehicles and mates with connectors on the trailer. In this regard, each connector of the present invention therefore corresponds to a predetermined function, illumination or signaling circuit of the trailer. When connected, energization of a selected trailer circuit will also energize a selected circuit within tester 10. This standardization of connectors with respect to a particular function or illumination circuit enables rapid connection and testing.

The tester 10 further includes a plurality of indicator lights 40, 41, 42, 43, 44, 45 and 46 preferably disposed on an upper panel 18 of the housing 12. As illustrated, the lights 40, 41, 42, 43, 44, 45 and 46 are mounted to the upper panel 18 such that the lights are exposed at the upper panel 18. In the version disclosed herein the lights 40, 41, 42, 43, 44, 45 and 46 are green, orange, red, white, bright yellow, dull yellow and dull yellow respectively. The green light 40 is used for testing the tester 10; orange light 41 for testing the trailer's brakes; white light 43 for testing the trailer's back-up lights; yellow light 44 for testing the trailer's marker lights; yellow light 45 for testing the trailer's right turn signal; and, yellow light 46 for testing the trailer's left turn signal.

In the preferred embodiment the lights are 12 volt bulbs, however, many types of light elements (e.g. bulbs, lamps, LED's) and color combinations thereof may be employed. Preferably, the indicator light should have a long service life. The colors are completely arbitrary and may be selected to provide for quick and convenient readings.

Lights 40, 41, 42, 43, 44, 45 and 46 are integrated electrically into the tester 10 and operable by means known in the art. FIGS. 3-9 illustrate the wiring diagrams and schematic drawings of a preferred electrical circuit employed in tester 10.

As illustrated, the housing 12 can further include a clip 24A disposed on the first side panel 16 of the housing. The clip 24A designed to temporarily receive and hold connector 24 approximately adjacent to the first side panel 16 when the connector 24 is not in use. That is, connector 24 can be plugged into clip 24A when it is not in use so that the connector is out of the way. The housing 12 may further include a storage bin 26 preferably disposed in the second side panel 17 of the housing 12. The storage bin 26 for storing miscellaneous small items that can be useful during application, such as a razor blade or spare light bulbs.

The housing 12 further includes a lower panel 19. The lower panel 19 includes a magnetic base 19A having a magnetic surface 19B. The magnetic base 19A therefore uses magnetic force to magnetically attach the tester 10 to a metal surface during application thereby freeing both hands of the user.

As illustrated, the lower panel 19 further includes a plurality of fuses 23 known in the art.

Figure 3:
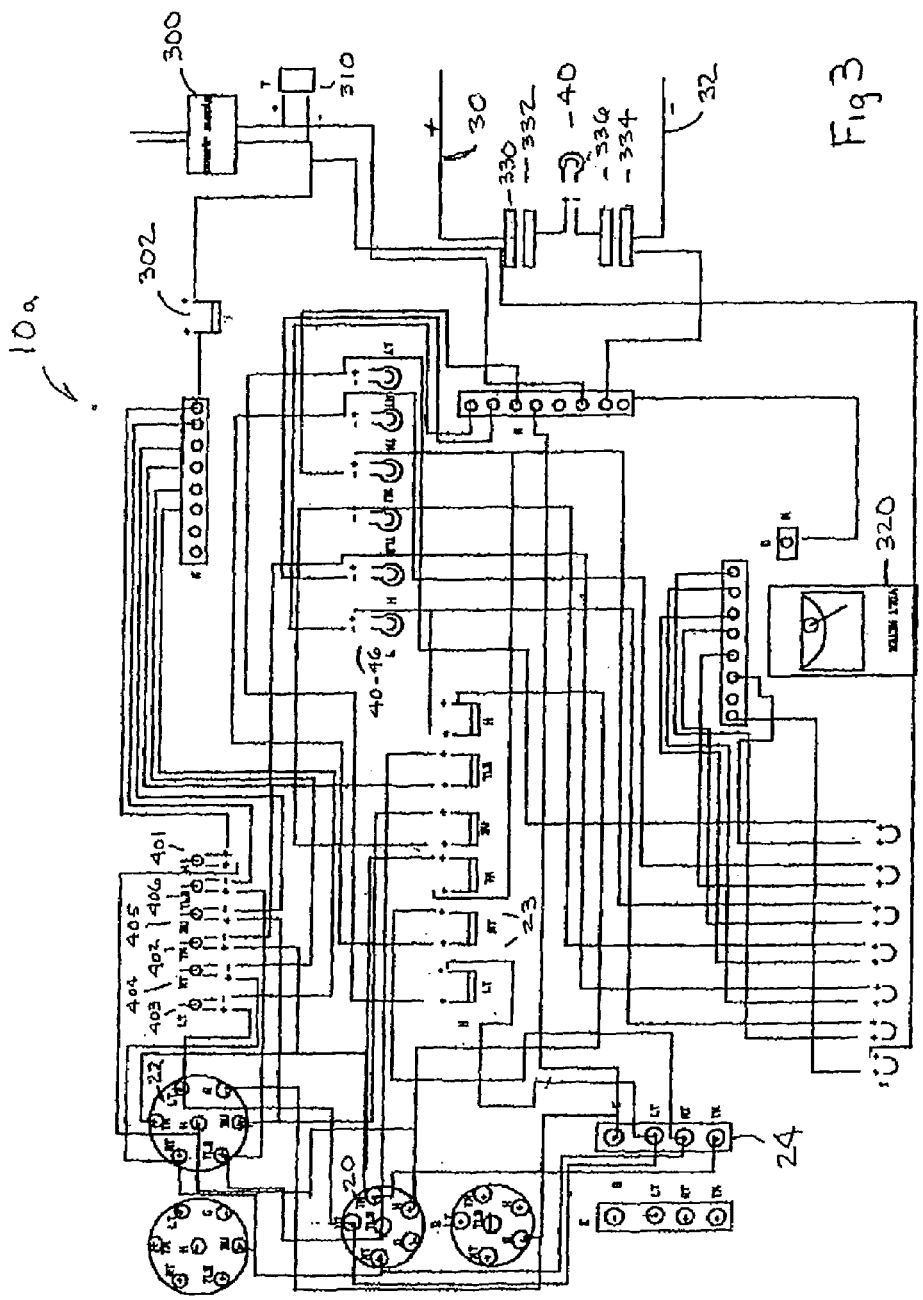
FIG. 3 illustrates the electric schematic of the circuitry of the invention.

FIG. 3 shows a wiring diagram for the tester circuit 10A. The tester 10 can include a power supply 300 which can be 120 volt power supply with converter to 12 volt DC or the power supply could be from the towing vehicle, for example. There are six switches in all; 401 hotwire, 402 marker, 403 left turn signal, 404 right turn signal, 405 backup, and 406 brake lights. There is an auxiliary power supply 310, for use as a battery charger with battery cables 410, 412 showing in FIG. 4. A volt meter 320 can indicate the voltage of power that is being supplied to the tester 10. There is a probe wire 30 connected to a stationary contact 330. The stationary contact 330 mates with a rotary contact 332 such that power is constantly supplied to the probe 30. There is a stationary contact 336 and rotary contact 334 for the ground wire 32 as well. Test light 40 is electrically connected between the rotary contacts 332, 336. The wiring diagram FIG. 3 shows the back-up lights 40-46 and fuses 23 for each test function. In use, an operator provides power to power source 300, plugs one of the connectors 20, 22, 24 into a trailer lighting circuit and then activates the switches 401-406 in any desired sequence to test the corresponding lighting circuit.

Figure 4:
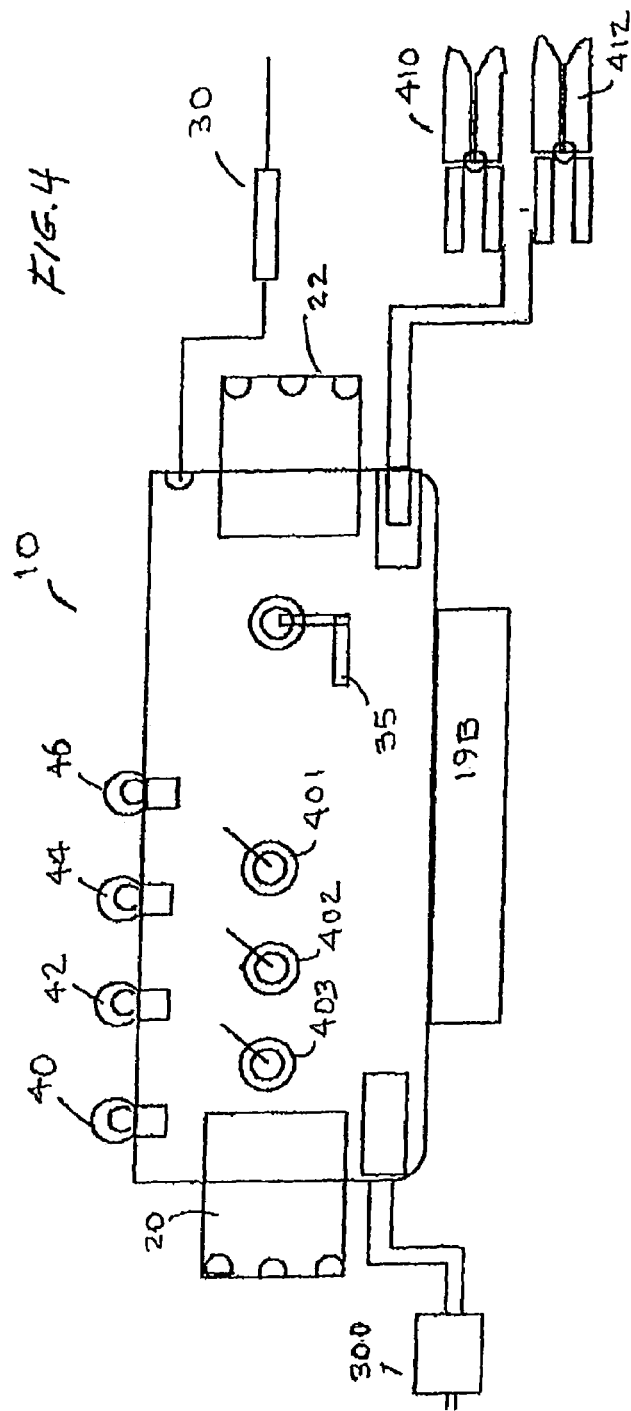
FIG. 4 shows a simplified block diagram of a side view of the device.

FIG. 4 shows a side view of the tester 10. Light 40 can indicate that the tester 10 itself is working properly. For example, the light 40 might light to indicate the tester 10 is in working order, providing a self-diagnostic capability. Lights 42, 44 and 46 are for hotwire, marker and left turn signal respectively. Micro switches 401, 402 and 403 can allow a user to selectively test individual functions, alternatively, a user can simply test all functions at once. There are six switches in all; 401 hotwire, 402 marker, 403 left turn signal, 404 right turn signal, 405 backup, and 406 brake lights. Switches 404, 405, and 406 are on the opposite side of the housing 12 and shown schematically in FIG. 3.

FIG. 4 shows a separate power supply 300. This can be a 120 volt power supply. Cables 410, 412 can be connected to a battery such as the battery of a towing vehicle such that the tester 10 can double as a battery charger.

Figure 5:
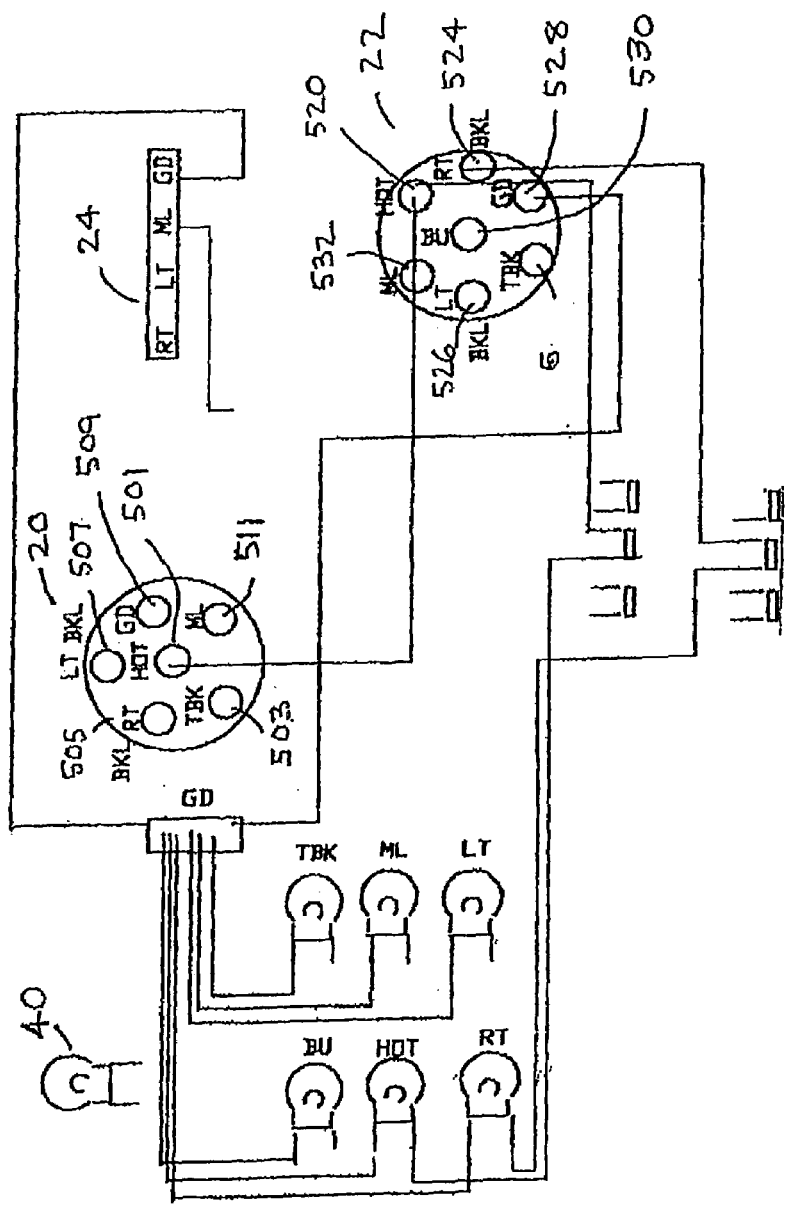
FIG. 5 shows details of the wiring diagram.

FIG. 5 shows that a 6-pin connector 20 has a pin for hotwire 501, trailer brake 503, right turn and back-up light 505, left turn and back-up light 507, ground 509, and miscellaneous lights such as running lights 511. The 7-pin connector 22 has hotwire 520, trailer brake 522, right turn/brake light 524, left turn/brake light 526, ground 528 and back-up light 530 and miscellaneous lights such as running lights 532.

Figure 6:
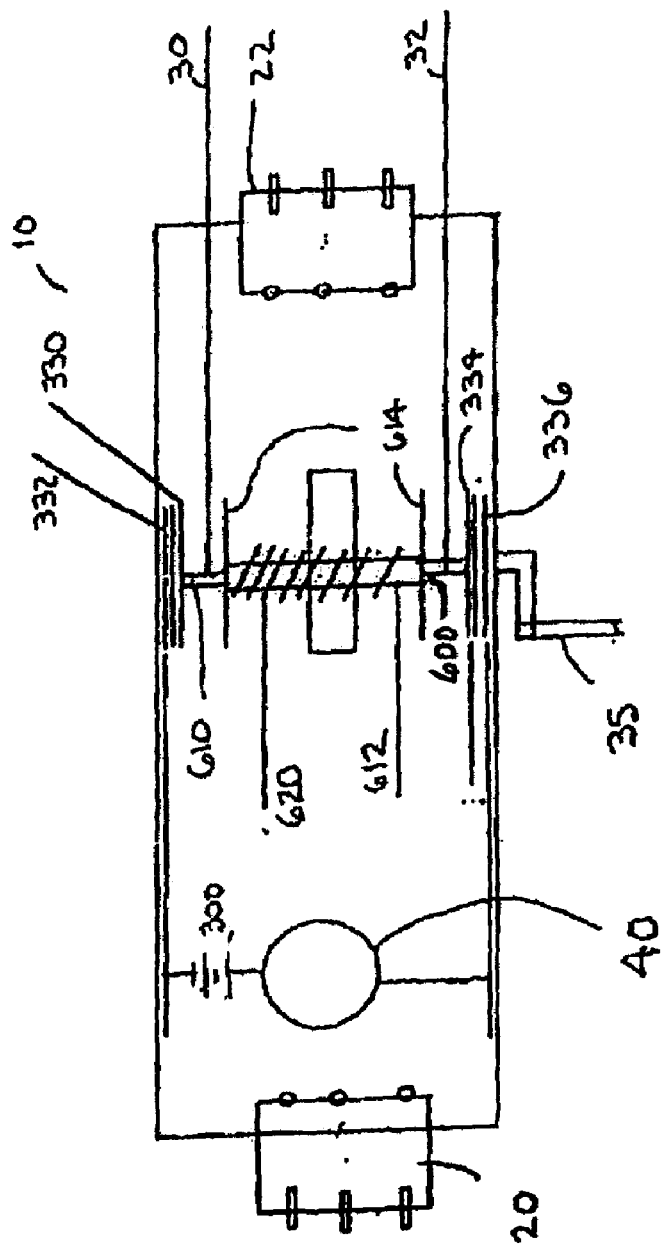
FIG. 6 shows interior details of the reel.

FIG. 6 shows details of a reel 600 and the tester 10. Probe 30 is the hot side of the circuit and is electrically and physically attached to rotary contact 330 which is mounted on axle 610. Spring 620 pushes rotary contact 330 into engagement and stationary contact 332. The rotary and stationary contacts 330, 332, 334 and 336 can be mating metal discs or plastic discs with metal contacts, for example. The spring 620 also tends to bias rotary contact disc 334 and stationary contact disc 336 into engagement on the ground side of the circuit such that when rotating the crank 35 to reel up the hot probe 30 and ground wire 32, the ground and probe remain electrically connected to the tester 10. The enlarged central portion 612 of the axle 610 can guide and retain the spring 620 and can be made of non-conductive material to isolate the hot from the ground. Spools 614 of reel 600 guide the wires 30 and 32 as they are wound up by crank 35.

Figure 7:
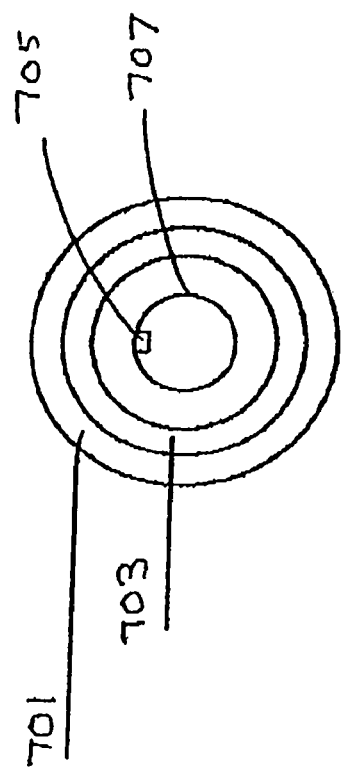
FIG. 7 shows additional details of the reel.

FIG. 7 shows an example of the rotary contact 334 where the disc body 701 is plastic and the contact track 703 is metal. The axle 610 can be keyed 705 to a central hole 707 in the disc body 701. The probe wire 30 can be connected to the contact track 703 by soldering, for example.

FIG. 8 includes FIG. 8A showing panel 14 with 6-prong connector 20 and FIG. 8B showing opposite end panel 15. Note the panel 14 includes holes 801 that allow for passage of wires 30 and 32 through the housing 12.

Figure 9:
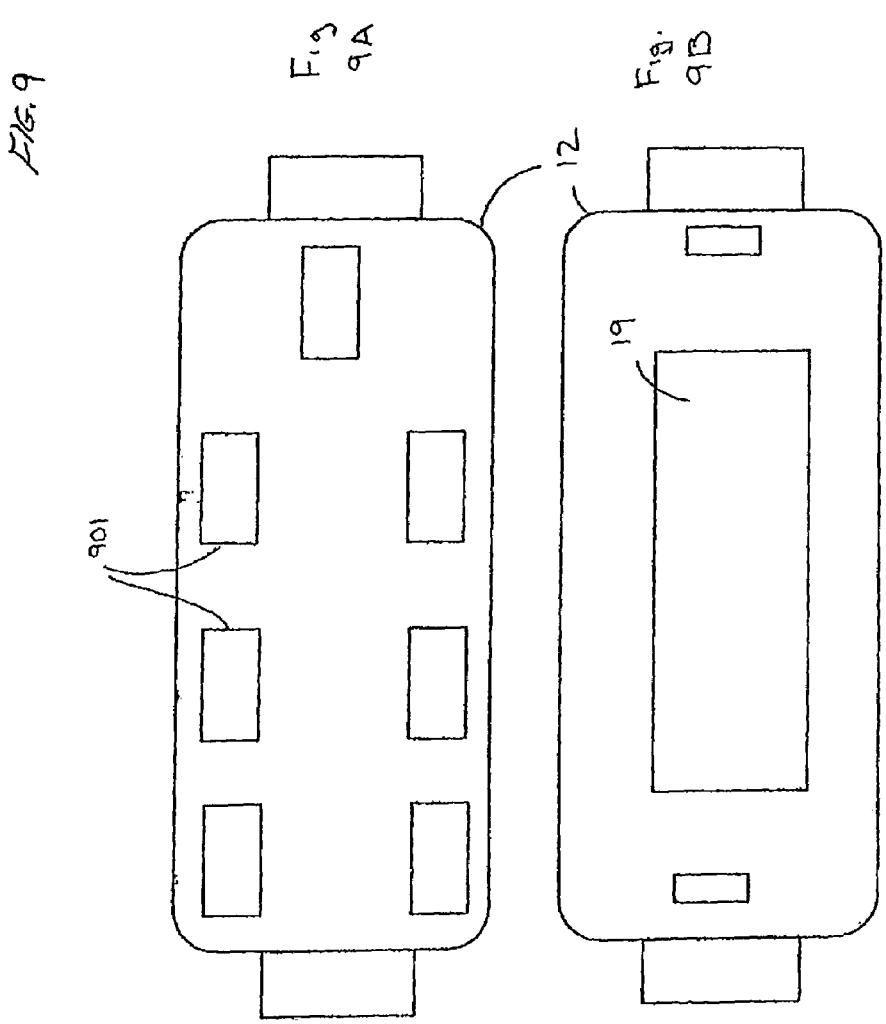
FIG. 9 shows details of the housing for the device.

FIG. 9 includes FIG. 9A showing the upper surface of the housing 12 and FIG. 9B shows the lower surface of housing 12. The housing 12 can be molded from plastic and include magnetic base 19A and openings 901 for lights 40-46 (shown in FIG. 1).

While the instant invention has been shown and described herein in what are conceived to be the most practical and preferred embodiments, it is recognized that departures may be made therefrom within the scope of the invention, which is therefore not to be limited to the details disclosed herein, but is to be afforded the full scope of the claims so as to embrace any and all equivalent compositions and methods.

As such, it will be obvious to those skilled in the art that modifications may be made to the embodiments described above without departing from the scope of the invention. Thus the scope of the invention should be determined by the claims in the formal application and their legal equivalents, rather than by the examples given.

I claim:

1. An apparatus for electrically testing the circuit system of a trailer, said apparatus comprising:
   a housing that encloses electrical circuitry and a reel, said housing comprising a first panel, a second panel, a first side panel, a second side panel, an upper panel, and a lower panel,
   wherein a first connector is provided on said first panel, a second connector is provided on said second panel, and a third connector is provided on said first side panel,
   a probe wire and a ground wire is further provided passing through said first panel, wherein opposite ends of said probe wire and ground wire are electrically connected inside the housing and are in further communication with said reel in the housing,
   a handle is disposed on said second housing and is attached to said reel such that turning the handle either reels or unreels the probe wire and the ground wire,
   a plurality of indicator lights disposed on said upper panel, said indicator lights are electrically connected to said connectors, wherein the reel includes spools to wind said probe wire and said ground wire on, and wherein said reel includes stationary contacts and rotary contacts such that said probe and said ground are electrically connected to said tester as they are wound onto said spools.

2. The apparatus as recited in claim 1, further including a plurality of fuses.

3. The apparatus as recited in claim 1, wherein the first connector is a 6-way connector.

4. The apparatus as recited in claim 1, wherein the second connector is a 7-way connector.

5. The apparatus as recited in claim 1, wherein the third connector is a 4 pin plug.

6. The apparatus as recited in claim 1, wherein the plurality of indicator lights comprising a first light used for testing the apparatus, a second light for testing the trailer's brakes, a third light for testing the trailer's back-up lights, a fourth light for testing the trailer's marker lights, a fifth light for testing the trailer's right turn signal, and a sixth light for testing the trailer's left turn signal.

7. A tester apparatus for electrically testing the circuit system of a trailer, said apparatus comprising:
   a housing that encloses electrical circuitry and a reel, said housing comprising at least a first panel, a first side panel, and an upper panel,
   wherein a first connector is provided on said first panel, a second connector is provided on said housing, and a third connector is provided on said first panel,
   a probe wire and a ground wire is further provided wherein opposite ends of said probe wire and ground wire are electrically connected inside the housing and are in further communication with said reel in the housing,
   a handle attached to said reel such that turning the handle either reels or unreels the probe wire and the ground wire,
   a plurality of indicator lights disposed on said upper panel, said indicator lights are electrically connected to said connectors to test the function of each connector, wherein the reel includes spools to wind said probe wire and said ground wire on, and wherein said reel includes stationary contacts and rotary contacts such that said probe and said ground are electrically connected to said tester as they are wound onto said spools.

8. The tester as recited in claim 7, wherein said first connector is a 6-pin connector, said second connector is a 7-pin connector and said third connector is a 4-pin connector.

9. The tester as recited in claim 7, wherein said plurality of indicator lights comprising a first light used for testing the apparatus, a second light for testing the trailer's brakes, a third light for testing the trailer's back-up lights, a fourth light for testing the trailer's marker lights, a fifth light for testing the trailer's right turn signal, and a sixth light for testing the trailer's left turn signal.

10. The tester as recited in claim 7, further including a volt meter to check the voltage of a power supply to said tester.

11. The tester as recited in claim 7, further including an auxiliary power outlet wherein said auxiliary power outlet includes battery clamps to provide a battery charger.

12. The tester as recited in claim 7, wherein said housing includes a magnetic base.

13. A tester for electrically testing the circuit system of a vehicle, said tester comprising:
   a housing that encloses electrical circuitry and a reel, said housing comprising at least a first surface, a second surface, and a third surface,
   wherein a first connector is provided on said first surface, a second connector is provided on said housing, and a third connector is provided on said housing,
   a probe wire and a ground wire are further provided wherein opposite ends of said probe wire and ground wire are electrically connected inside the housing and are in further communication with said reel in the housing,
   an operator attached to said reel such that turning the operator either reels or unreels the probe wire and the ground wire,
   a plurality of indicators disposed on said third surface, said indicators are electrically connected to said connectors to test the function of each connector, wherein the reel includes spools to wind said probe wire and said ground wire on, and wherein said reel includes stationary contacts and rotary contacts such that said probe and said ground are electrically connected to said tester as they are wound onto said spools.

14. The tester as recited in claim 13, wherein said plurality of indicators comprising a first light of a first color used for testing the apparatus, a second light of a second color for testing the trailer's brakes, a third light for testing the trailer's back-up lights, a fourth light for testing the trailer's marker lights, a fifth light for testing the trailer's right turn signal, and a sixth light for testing the trailer's left turn signal.

15. The tester as recited in claim 13, further including a volt meter to check the voltage of a power supply to said tester.

16. The tester as recited in claim 15, further including a battery charger including battery clamps.

17. The tester as recited in claim 16, wherein said first connector is a 6-pin connector, said second connector is a 7-pin connector and said third connector is a 4-pin connector.

* * * * *